United States Patent

Arcesi et al.

[15] 3,640,722

[45] Feb. 8, 1972

[54] LIGHT-SENSITIVE POLYSULFONATES REACTION PRODUCT OF AROMATIC DISULFONYL CHLORIDE AND BISPHENOL CONTAINING STYRYL KETONE GROUP

[72] Inventors: Joseph A. Arcesi; Frederick J. Rauner, both of Rochester, N.Y.

[73] Assignee: Eastman Kodak Company, Rochester, N.Y.

[22] Filed: Sept. 22, 1969

[21] Appl. No.: 860,081

[52] U.S. Cl. ..........96/115 P, 96/35.1, 204/159.22

[51] Int. Cl. ..........C08g 17/13

[58] Field of Search ..........96/115, 35.1, 86; 204/159, 204/22, 159.23, 159.24; 260/47, 49, 50

[56] References Cited

UNITED STATES PATENTS

| | | | |
|---|---|---|---|
| 3,043,802 | 7/1962 | Rinke | 96/115 X |
| 3,236,809 | 2/1966 | Goldberg | 260/49 |
| 3,271,368 | 9/1966 | Goldberg | 260/49 |
| 3,375,229 | 3/1968 | Borden | 96/115 X |
| 3,453,237 | 7/1969 | Borden | 96/86 X |
| 3,467,630 | 9/1969 | Danhauser | 96/115 X |

*Primary Examiner*—John T. Goolkasian
*Assistant Examiner*—M. E. McCamish
*Attorney*—William H. J. Kline, James R. Frederick and Joshua G. Levitt

[57] ABSTRACT

A light-sensitive polysulfonate contains units derived from an aromatic disulfonyl chloride, units derived from a light-sensitive bisphenol containing the styryl ketone group, and, optionally, units derived from a non-light-sensitive bisphenol. The polysulfonate is useful in preparing photomechanical images such as photoresists and lithographic plates.

20 Claims, No Drawings

LIGHT-SENSITIVE POLYSULFONATES REACTION PRODUCT OF AROMATIC DISULFONYL CHLORIDE AND BISPHENOL CONTAINING STYRYL KETONE GROUP

This invention relates to photographic reproduction. In a particular aspect it relates to a novel class of light-sensitive polysulfonates and the use of such polymers in the preparation of photographic images.

It is known in the photographic art to reproduce images by processes which involve imagewise exposure of a coating of a radiation-sensitive material, the solubility of which is differentially modified by the action of radiation, and subsequent treatment of the coating with a solvent or solvent system which preferentially removes portions of the coating in accordance with its exposure to light. Such processes have been employed to prepare lithographic printing plates, stencils, photoresists, and similar photomechanical images. Among the radiation-sensitive materials which have been used in such processes, are light-sensitive polymers which are insolubilized or hardened on exposure to light. Typical of these light-sensitive polymers are the cinnamic acid esters of hydroxy polymers such as are described in Minsk et al. U.S. Pat. No. 2,690,966, Minsk U.S. Pat. No. 2,725,372, and Robertson et al., U.S. Pat. No. 2,732,301; cinnamylidene malonate polyesters such as are described in Michiels et al. U.S. Pat. No. 2,956,878, and Clement et al. U.S. Pat. No. 3,173,787; polyester and polycarbonates containing the styryl ketone group such as are described in Borden et al. U.S. Pat. No. 3,453,237; and the like.

Since many of these light-sensitive polymers are not alkali resistant, but are hydrolyzed upon contact with strong alkali, it is necessary that resists prepared from these polymers be used only with acidic etchants. In those instances where it is desired that an alkaline etchant be used, other photosensitive compositions must be used, such as those based on azide sensitized rubbers described in Hepher et al. U.S. Pat. No. 2,852,379 and Sagura et al. U.S. Pat. No. 2,940,853 and similar compositions in which a non-light-sensitive component, such as the rubber is sensitized to light by a light-sensitive monomer, such as the azide.

Polysulfonates are known to be alkali resistant and it would be desirable if a light-sensitive polysulfonate were prepared for use in the preparation of alkali resistant photoresists. Among the polyesters named in the above-mentioned Borden et al. U.S. Pat. No. 3,453,237, is one prepared from a sulfur-containing acid which as thionyl chloride. However, preparation of such polymers is uneconomic since thionyl chloride tends to hydrolyze rapidly and hence large excesses of the thionyl chloride reactant must be used in the preparation of such polymers.

Accordingly, it is an object of this invention to provide a novel class of light-sensitive polymers.

It is a further object of this invention to provide novel light-sensitive alkali resistant polysulfonates having improved resistance to hydrolysis.

It is still a further object of this invention to prepare novel light-sensitive polysulfonates using stoichiometric amounts of reactants.

It is another object of this invention to provide novel photosensitive compositions and elements containing novel light-sensitive polysulfonates which are useful in the preparation and reproduction of photomechanical images.

It is yet another object of this invention to provide novel processes for the preparation of photomechanical images using the novel light-sensitive polysulfonates of this invention.

The light-sensitive polysulfonates of this invention contain recurring units derived from an aromatic disulfonyl chloride and recurring units derived from a bisphenol containing the styryl ketone group

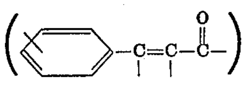

These polymers exhibit good light sensitivity and upon exposure to actinic radiation crosslink and harden to give alkali-resistant materials which are useful as photoresists. The polymers can be prepared by reacting an aromatic disulfonyl chloride and a bisphenol reactant, preferably in stoichiometric amounts, under basic conditions in the presence of a suitable catalyst.

The aromatic disulfonyl chlorides which can be used to prepare light-sensitive polysulfonates of this invention can be represented by the formula:

$$Cl-\overset{O}{\underset{O}{\overset{\|}{\underset{\|}{S}}}}-Ar-\overset{O}{\underset{O}{\overset{\|}{\underset{\|}{S}}}}-Cl$$

wherein Ar represents an arylene group such as a phenylene group, a biphenylene group, a naphthylene group, an anthrylene group, etc., including arylene groups substituted with substituents which will not interfere with the polymerization reaction such as halogen, nitro, cyano, lower alkyl of one to 12 carbon atoms, e.g., methyl, ethyl, propyl, isopropyl, butyl, sec-butyl, t-butyl, n-amyl, isoamyl, hexyl, heptyl, octyl, nonyl, decyl, undecyl, dodecyl, etc., lower alkoxy of one to 12 carbon atoms, e.g., methoxy, ethoxy, propoxy, butoxy, amyloxy, hexoxy, heptoxy, etc., and the like.

Representative aromatic disulfonyl chlorides which are useful in preparing light-sensitive polysulfonates of this invention include:

benzenedisulfonyl chlorides such as
1,3-benzenedisulfonyl chloride,
1,4-benzenedisulfonyl chloride,
1-chloro-2,4-benzenedisulfonyl chloride,
1-bromo-3,5-benzenedisulfonyl chloride,
1-nitro3,5benzenedisulfonyl chloride,
1-cyano-3,5-benzenedisulfonyl chloride,
1-methyl-2,4-benzenedisulfonyl chloride,
1-methyl-4-chloro-2,6-benzenedisulfonyl chloride,
1-ethyl-2,4-benzenedisulfonyl chloride,
1-butyl-2,4-benzenedisulfonyl chloride,
1,2-dimethyl-3,5-benzenedisulfonyl chloride,
1,3-dimethyl-2,4-benzenedisulfonyl chloride,
1,3-dimethyl-4,6-benzenedisulfonyl chloride,
1,4-dimethyl-2,6-benzenedisulfonyl chloride,
1-methoxy-2,4-benzenedisulfonyl chloride; biphenyldisulfonyl chloride such as
2,2'-biphenyldisulfonyl chloride,
3,3'-biphenyldisulfonyl chloride,
4,4'-biphenyldisulfonyl chloride,
4,4'-dibromo-3,3'-biphenyldisulfonyl chloride,
4,4'-dimethyl-3,3'-diphenyldisulfonyl chloride;
naphthalene- and anthracenedisulfonyl chlorides such as
1,3-naphthalenedisulfonyl chloride
2,6-naphthalenedisulfonyl chloride,
1-chloro-2,7-naphthalenedisulfonyl chloride,
1-chloro-3,5-naphthalenedisulfonyl chloride,
1-nitro-3,6-naphthalenedisulfonyl chloride,
2-ethoxy-1,6-naphthalenedisulfonyl chloride,
1,5-anthracenedisulfonyl chloride,
1,8anthracenedisulfonyl chloride, etc.; and the like.

A particularly useful class of aromatic disulfonyl chlorides can be represented by the structural formula:

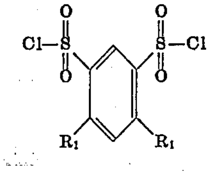

wherein each $R_1$ is independently a hydrogen atom or a lower alkyl group typically having one to four carbon atoms, e.g., methyl, ethyl propyl, etc.

Light-sensitive bisphenol reactants which can be used to prepare light-sensitive polysulfonates of this invention include dihydroxy chalcones and dihydroxy dibenzal ketones such as:

4,4'-dihydroxychalcone,
2,6-bis(3-hydroxybenzal)cyclohexanone,
2,6-bis(4-hydroxybenzal)cyclohexanone,
di-m-hydroxybenzalacetone,
divanillalacetone,
divanillalcyclohexanone,
divanillal-4-methylcyclohexanone,
divanillal-4-t-butylcyclohexanone,
divanillalcyclopentanone,
di-(nitrovanillal)cyclopentanone,
divanillalcycloheptanone,
divanillalcyclooctanone,
disyringalcyclopentanone,
disyringalacetone,
disalicylalacetone,
disalicylalcyclopentanone, and
1,5-bis(4-hydroxy-3-methoxyphenyl)-2-methyl-1,4-pentadien-3-one.

A particularly useful class of light-sensitive bisphenol reactants have the structural formula:

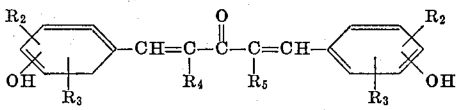

wherein $R_2$ and $R_3$ are each hydrogen atoms or lower alkoxy groups typically having one to four carbon atoms, e.g., methoxy, ethoxy, etc., and $R_4$ and $R_5$ are each a hydrogen atom or together represent the hydrocarbon radical necessary to complete a saturated ring of five to six carbon atoms.

The bisphenol reactants can be employed singly or in mixtures in the preparation of the polysulfonates. It has been found that the incorporation of from about 5–95 percent by weight of certain non-light-sensitive bisphenols in the bisphenol reactant mixture improves the solubility and molecular weight of the light-sensitive polymers derived therefrom. The ratio of light-sensitive bisphenol to non-light-sensitive bisphenol can be varied at will within the range from about 5–95 mole percent light-sensitive to 95–5 mole percent non-light-sensitive bisphenol depending upon the effect desired. It has been found that the use of from about 40–60 mole percent of non-light-sensitive bisphenol produces the most useful polymers and achieves a desirable balance between light sensitivity and solubility. Suitable non-light-sensitive bisphenols which can be used include:

2,2-bis(4-hydroxyphenyl)propane [Bisphenol A],
2,2-bis(4-hydroxy-3,5-dichlorophenyl)propane [Tetrachloro Bisphenol A],
2,2-bis(4-hydroxy-3,5-dibromophenyl)propane [Tetrabromo Bisphenol A],
2,2-bis(4-hydroxy-3,5-diiodophenyl)propane [Tetraiodo Bisphenol A],
bis(4-hydroxyphenyl)methane,
bis(4-hydroxyphenyl)ether,
2,2'-bis(4-hydroxyphenyl)hexane,
1,5-bis(4-hydroxy-3-methoxyphenyl)pentan-3-one,
2,6-bis(4-hydroxy-3-methoxybenzyl)cyclohexanone,
2,5-bis(4-hydroxy-3-methoxybenzyl)cyclopentanone,
4,4'-dihydroxydiphenyl sulfone,
alizarin,
quinizarin,
anthrarufin,
4,8-di-p-toluidinoanthrarufin,
1,4-bis(p-hydroxyanilino)anthraquinone,
dibenzoylresorcinol,
4-phenylazoresorcinol,
4'-nitro-4-phenylazoresorcinol,
4'-nitro-4-phenylazoresorcinol,
3'-nitro-4-phenylazoresorcinol,
N,N-bis(p-hydroxybenzoyl)-p-phenylenediamine,
p-xylylidene bis(p-hydroxyaniline),
salicylalazine,
2,2'-dihydroxy-1,1'-naphthalazine,
divanillalazine,
4,4'-dihydroxy-3,3'-dimethoxy-5,5'-dinitrobenzalazine,
N[5-(2-benzo[b]thiazolylidene)-1-(3,4-dihydroxybenzoyl-penta-1,3-dienyl]pyridinium iodide, and
1-cyano-1-(3,4dihydroxybenzoyl)-2-[julolidin-9-yl]ethane.

A particularly useful class of non-light-sensitive bisphenol reactants can be represented by the structural formula:

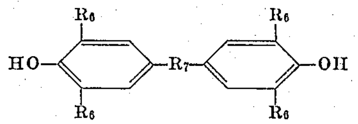

wherein $R_6$ is a hydrogen, chlorine, or bromine atom and $R_7$ is an alkylene group of one to eight carbon atoms, e.g., methylene, ethylene, propylene, hexylene, etc., or an oxoalkylene group of three to eight carbon atoms, e.g., 3-oxopentamethylene, 2-oxo-1,3-cyclopentylene, 2-oxo-1,3-cyclohexylene, etc.

Typically, these light-sensitive polysulfonates are prepared by allowing an appropriate bisphenol to react with an aromatic disulfonyl chloride in the presence of a suitable catalyst. This reaction can take place in a suitable basic solvent, using a solution polymerization technique. However, it is preferred that the polymer be prepared by interfacial polymerization, the reaction taking place at the interface of a two-phase solvent system. The bisphenol reactant and the catalyst, preferably a basic catalyst such as a quaternary ammonium salt, are normally dissolved in aqueous sodium hydroxide. The aromatic disulfonyl chloride is customarily dissolved in a water-immiscible inert organic solvent, such as methylene chloride, which also has solvent action for the polymer. The two-phase reaction mixture is then stirred while the desired polymer is formed at the interface. Although the polymer solution usually attains a good viscosity after a few minutes, it has been found that the light-sensitivity of the resulting polymer can be increased by prolonging the reaction time beyond this point. The condensation reaction can be allowed to go to completion or it can be stopped when sufficiently complete by the addition of acetic acid. The desired polymer, present in the methylene chloride layer is separated by precipitation in water, filtered and washed with water and then with methanol.

Reaction times of about 50 to 100 minutes are generally sufficient at temperatures of about 3° to 25° C., although longer or shorter times and somewhat lower or higher temperatures can be employed with success in some instances. The optimum reaction conditions for the formation of the polymers will vary with the specific reactants and catalysts employed as well as other factors. It has been found, however, that excellent high-viscosity polymers are generally obtained at reaction temperatures in the range from about 15° to 25° C.

Inasmuch as the polymers are formed at the interface of a two-phase system, it is advantageous to employ a catalyst which is also an effective surfactant. Quaternary salts such as benzyl triethyl ammonium chloride are suitable catalysts.

Coating compositions containing the light-sensitive polymers of this invention can be prepared by dispersing or dissolving the polymer in any suitable solvent or combination of solvents used in the art to prepare polymer dopes. Solvents that can be used to advantage are volatile organic solvents and include ketones such as 2-butanone, 4-methyl-2-pentanone, cyclohexanone, 4-butyrolactone, 2,4-pentanedione, 2,5-hexanedione, etc.; esters such as 2-ethoxyethyl acetate, 2-methoxyethyl acetate, n-butyl acetate, etc.; chlorinated hydrocarbon solvents such as chloroform, dichloroethane, trichloroethane, tetrachloroethane, etc.; as well as dimethylformamide and dimethylsulfoxide; and mixtures of these solvents. Typically the light-sensitive polymer is employed in the coating composition in the range from about 1 to 20 percent by weight. Preferably the polymer comprises 2 to 10 percent by weight of the composition in a solvent such as listed above. The coating compositions also can include a variety of photographic addenda utilized for their known purpose, such as agents to modify the flexibility of the coating, agents to modify its surface characteristics, dyes and pigments to impart color to the coating, agents to modify the adhesivity of the coating to the support, antioxidants, preservatives, and a variety of other addenda known to those skilled in the art.

The coating compositions can be spectrally sensitized with such sensitizers as pyrylium and thiapyrylium salts, thiazoles, benzothiazolines, naphthothiazolines, quinolizones, acridones, cyanine dyes, dithiolium salts, Michler's ketone, Michler's thioketone, and the like sensitizers. When a sensitizer is employed, it can be present in amounts of about 0.1 to 10 percent by weight of the light-sensitive polymer, and it is preferably employed in the range of about 0.2 to 3 percent by weight of the light-sensitive polymer.

The light-sensitive polymer of this invention can be the sole polymeric constituent of the coating composition or other polymers can be incorporated therein to modify the physical properties of the composition and serve as a diluent. For example, phenolic resins, such as thermoplastic novolac resins or solvent-soluble resole resins can be incorporated in the composition to improve the resistance of the polymer composition to etchants when it is used as a photoresist. These other polymeric materials can constitute up to 25 percent by weight of the polymeric components of the coating composition.

Photosensitive elements can be prepared by coating the photosensitive compositions from solvents onto supports in accordance with usual practices. Suitable support materials include fiber base materials such as paper, polyethylene-coated paper, polypropylene-coated paper, parchment, cloth, etc.; sheets and foils of such metals as aluminum, copper, magnesium, zinc, etc.; glass and glass coated with such metals as chromium, chromium alloys, steel, silver, gold, platinum, etc.; synthetic polymeric materials such as poly(alkyl methacrylates), e.g., poly(methyl methacrylate), polyester film base, e.g., poly(ethylene terephthalate), poly(vinyl acetals), polyamides, e.g., nylon, cellulose ester film base, e.g., cellulose nitrate, cellulose acetate, cellulose acetate propionate, cellulose acetate butyrate, and the like. The optimum coating thickness for a particular purpose will depend upon such factors as the use to which the coating will be put, the particular light-sensitive polymer employed, and the nature, of other components which may be present in the coating. Typical coating thickness can be from about 0.1 to 0.5 mil.

Photomechanical images can be prepared with photosensitive elements by imagewise exposing the element to a light source to harden or insolubilize the polymer in exposed areas. Suitable light sources which can be employed in exposing the elements include sources rich in visible radiation and sources rich in ultraviolet radiation, such as carbon arc lamps, mercury vapor lamps, fluorescent lamps, tungsten lamps, photoflood lamps, lasers, and the like.

The exposed element can be developed with a solvent for the unexposed, uncrosslinked polymer which is a nonsolvent for the exposed hardened polymer. Such solvents can be selected from the solvents listed above as suitable coating solvents as well as others.

The following examples further illustrate this invention.

EXAMPLE 1

In a 1,000-ml. resin kettle equipped with a dropping funnel and a metal stirring rod are placed 11.4 g. (0.05 mole) of bisphenol A, 17.6 g. (0.05 mole) of divanillalcyclopentanone and 200 ml. of 1N sodium hydroxide (0.2 mole). The solution is stirred for 25 minutes and 0.55 g. (1 percent weight based on the weight of reactants) of benzyltriethyl ammonium chloride is added. The solution is stirred an additional 5 minutes. To this stirred solution is added dropwise over a 10-minute period, a solution of 27.5 g. (0.1 mole) of 1,3-benzenedisulfonyl chloride in 200 ml. of methylene chloride. The reaction mixture is stirred vigorously for 1 hour and 20 minutes. At the endpoint of the reaction, a yellow color develops and the stirring is terminated. The polymer is isolated by dripping the mixture into hot water with vigorous stirring. The polymer is filtered, washed on the filter with water, then with methanol, and dried in a vacuum over at 50° C. The polymer is isolated in better than 90 percent yield (47 grams). The inherent viscosity of 60:40 mixture of cyclohexanone and 4-butyrolactone (0.25 g. polymer/100 cc. solution at 25° C.) is 0.24.

EXAMPLE 2

In a 1,000-ml. resin kettle equipped with a dropping funnel, a condenser and an efficient stirrer are placed 9.12 g. (0.04 mole) of bisphenol A, 13.04 g. (0.04 mole) of divanillalacetone and 160 ml. of 1N sodium hydroxide (0.16 mole). The solution is stirred for 15 minutes and 0.44 g. of benzyltriethylammonium chloride is added (1 percent by weight based on the weight of the reactants). The solution is stirred for an additional 5 minutes. To this stirred solution, at room temperature, is added dropwise over a 10-minute period 22.0 g. (0.08 mole) of 1,3-benzenedisulfonyl chloride dissolved in 160 ml. of methylene chloride. After 2 hours, the wine-red color characteristic of the disodium salt of the divanillalacetone disappears and the reaction mixture turns yellow in color. The stirring is terminated after 2 hours. The polymer is isolated by dipping the mixture into hot water with vigorous stirring, The resulting mixture is filtered and the polymer washed on the filter with water, then with methanol, and then dried in a vacuum oven at 40° C. for 24 hours. The yellow polymer is isolated in better than 90 percent yield. The inherent viscosity, measured as in Example 1, is 0.68.

EXAMPLES 3 to 17

Additional polymers are prepared by the procedure described in Example 2 with the exceptions that the reaction times are 3.5 hours, a 5–10 percent excess of sodium hydroxide is used, and the addition of the disulfonyl chlorides is rapid (1–2 minutes). The reactants used to prepare these additional polymers are given in Table I. The bisphenol reactants employed are identified as follows:

BPA = Bisphenol A
HDVA =1,5-Bis(4-hydroxy-3-methoxyphenyl)pentan-3-one (hydrogenated divanillalacetone)
DVA = Divanillalacetone
DVCP = Divanillalcyclopentanone

TABLE 1

| Example | Bisphenol (nonlight-sensitive) | Mole percent | Bisphenol (light-sensitive) | Mole percent | Aryl disulfonyl chloride | Mole percent |
|---|---|---|---|---|---|---|
| 3 | BPA | 25 | DVA | 25 | 1,3-benzenedisulfonyl chloride | 50 |
| 4 | BPA | 25 | DVA | 25 | 1-methyl-2,4-benzenedisulfonyl chloride | 50 |
| 5 | BPA | 25 | DVA | 25 | do | 50 |
| 6 | BPA | 25 | DVA | 25 | do | 50 |
| 7 | BPA | 25 | DVA | 25 | 1,3-dimethyl-4,6-benzenedisulfonyl chloride | 50 |
| 8 | HDVA | 25 | DVA | 25 | 1,3-benzenedisulfonyl chloride | 50 |
| 9 | HDVA | 25 | DVA | 25 | 1-methyl-2,4-benzenedisulfonyl chloride | 50 |
| 10 | HDVA | 25 | DVA | 25 | 1,3-dimethyl-4,6-benzenedisulfonyl chloride | 50 |
| 11 | BPA | 25 | DVCP | 25 | 1,3-benzenedisulfonyl chloride | 50 |
| 12 | BPA | 25 | DVCP | 25 | 1-methyl-2,4-benzenedisulfonyl chloride | 50 |
| 13 | BPA | 25 | DVCP | 25 | do | 50 |
| 14 | BPA | 25 | DVCP | 25 | 1,3-dimethyl-4,6-benzenedisulfonyl chloride | 50 |
| 15 | HDVA | 25 | DVCP | 25 | 1,3-benzenedisulfonyl chloride | 50 |
| 16 | HDVA | 25 | DVCP | 25 | 1-methyl-2,4-benzenedisulfonyl chloride | 50 |
| 17 | HDVA | 25 | DVCP | 25 | 1,3-dimethyl-4,6-benzenedisulfonyl chloride | 50 |

EXAMPLE 18

Physical properties of the polymers prepared in Examples 1 to 17 are determined and are given in Table II. All inherent viscosities ($\eta$ inherent) are determined at 25° C. in a 1:1 by volume solvent mixture of phenol and chlorobenzene using 0.25 g. of polymer per 100 cc. of solution, except the copolymers of Examples 1, 2 and 4, for which a 60:40 by volume solvent mixture of cyclohexanone and 4-butyrolactone is used in the same polymer concentration. The sensitivity values are determined by the procedure of L. M. Minsk et al. "Photosensitive Polymers, I & II" *Journal of Applied Polymer Science;* Vol. II, No. 6, pp. 302–311 (1959). This is a measure of the relative speed of the polymer, when exposed to ultraviolet or visible light, compared with the speed of unsensitized polyvinyl cinnamate as a standard. Glass transition temperature (*Ig*) is the temperature at which an amorphous polymer changes from a brittle, glasslike state to a rubbery, fluid state. The solvent compositions employed in preparing the 10 percent polymer solutions are identified as follows:

1. 1,2-Dichloroethane:cyclohexanone, 80:20 percent by volume
2. 1,1,2-Trichloroethane:cyclohexanone, 80:20 percent by volume
3. 2-methoxyethyl acetate:cyclohexanone, 80:20 percent by volume
4. Cyclohexanone:4-butyrolactone, 80:20 percent by volume The mixture is heated to aid solution, then coated on an anodized lithographic aluminum plate, exposed for about 8 minutes at 2,000 foot candles, and developed with cyclohexanone. The plate is run on a duplicator press and over 300 impressions are made.

EXAMPLE 22-PHOTORESIST ON COPPER

A formulation is prepared from:

| | |
|---|---|
| Copolymer of Example 2 | 13.3 g. |
| Cyclohexanone | 80 cc. |
| 4-Butyrolactone | 26 cc. |
| 1,2-Dichloroethane | 26 cc. |

The above mixture is heated to effect solution, the solution is filtered, whirl coated on a pumiced copper support, and prebaked at 80° C. for 10 minutes. The resulting photoresist element is exposed imagewise for 5 minutes to a 95-ampere carbon arc at a distance of 4 feet and is then tray developed in a 50:50 mixture of cyclohexanone and 1,2-dichloroethane. The polymer in the unexposed areas is removed. The resulting element is rinsed with acetone and post baked for 10 minutes at 160° C. The plate is then etched for 28 minutes in 42° Be ferric chloride at 150° C. The polymer shows no sign of degradation.

TABLE II

| Polymer of example | Elemental analysis | | | | | | $\eta$, inherent | Sensitivity value | Tg, °C. | Solvent for at least 10 g. of polymer/100 cc. solvent |
|---|---|---|---|---|---|---|---|---|---|---|
| | Calcd. | | | Found | | | | | | |
| | C | H | S | C | H | S | | | | |
| 1 | 58.6 | 4.1 | 13.0 | 58.6 | 4.1 | 13.0 | 0.24 | 1,100 | 134 | 4. |
| 2 | 57.5 | 4.0 | 13.4 | 57.3 | 4.4 | 13.7 | 0.68 | 2,500 | 130 | 4. |
| 3 | 57.5 | 4.0 | 13.4 | 56.9 | 3.8 | 13.0 | 0.69 | 2,500 | ------- | 4. |
| 4 | 58.4 | 4.2 | 13.0 | 57.6 | 4.6 | 12.9 | 0.54 | 2,000 | ------- | 1, 2, 3 and 4. |
| 5 | 58.4 | 4.2 | 13.0 | 57.9 | 4.3 | 13.4 | 1.0 | 2,500 | ------- | 1, 2, 3 and 4. |
| 6 | 58.4 | 4.2 | 13.0 | 58.8 | 4.7 | 12.7 | 0.57 | 1,600 | 141 | 1, 2, 3 and 4. |
| 7 | 59.2 | 4.5 | 13.0 | 58.8 | 4.8 | 12.6 | 0.59 | 1,100 | ------- | 1, 2, 3 and 4. |
| 8 | 57.0 | 3.9 | 12.1 | 54.8 | 4.1 | 12.4 | 0.79 | 2,500 | ------- | 4. |
| 9 | 57.4 | 4.1 | 11.8 | 57.0 | 4.4 | 11.9 | 0.47 | 1,000 | ------- | 1, 2, 3 and 4. |
| 10 | 58.1 | 4.4 | 11.5 | 58.0 | 4.6 | 11.1 | 0.56 | 1,000 | ------- | 1, 2, 3 and 4. |
| 11 | 58.6 | 4.1 | 13.0 | 58.6 | 4.1 | 13.0 | 0.72 | 7,000 | 147 | 4. |
| 12 | 59.1 | 4.3 | 12.6 | 59.4 | 4.7 | 12.6 | 0.92 | 7,000 | ------- | 1, 2 and 4. |
| 13 | 59.1 | 4.3 | 12.6 | 59.4 | 4.3 | 12.2 | 0.88 | 7,000 | ------- | 1, 2 and 4. |
| 14 | 60.0 | 4.6 | 12.6 | 60.2 | 4.7 | 12.2 | 0.96 | 7,000 | ------- | 4. |
| 15 | 57.4 | 4.2 | 11.8 | 57.8 | 4.6 | 11.4 | 0.78 | ------- | ------- | 4. |
| 16 | 58.1 | 4.5 | 11.5 | 57.4 | 4.8 | 11.8 | 0.74 | 3,600 | ------- | 1, 2 and 4. |
| 17 | 58.0 | 4.7 | 11.2 | 59.6 | 4.7 | 11.2 | 0.63 | 5,000 | ------- | 4. |

EXAMPLE 19-PHOTORESIST ON COPPER

A formulation is prepared from:

Five gram of the light-sensitive polysulfonate copolymer of Example 1

Thirty cubic centimeters of cyclohexanone

Twenty cubic centimeters of 4-butyrolactone

The above mixture is warmed to complete solution. The resulting solution is filtered, coated on copper, dried, exposed for 8 minutes with a carbon arc (2,000 foot candles), and developed with a mixture of cyclohexanone, propylene carbonate, and methanol. The processed plate is post baked at 120° C. for 15 minutes before etching and then etched for 6 minutes at 150° C. in 42° Be ferric chloride, The polymer shows no signs of degradation.

EXAMPLE 20-PHOTORESIST ON ALUMINUM

Using the formulation and procedure of Example 19, the polymer is coated on aluminum and etched in 20 percent sodium hydroxide at 75° C. for periods of 10 and 20 minutes. No degradation of the resist is observed.

EXAMPLE 21-LITHOGRAPHIC PRINTING PLATE

A formulation is prepared from:

0.8 g. of the polymer of Example 1

Twelve cubic centimeters of cyclohexanone

Eight cubic centimeters of 4-butyrolactone

EXAMPLE 23-PHOTORESIST ON ALUMINUM

Using the formulation and procedure described in Example 22, the polymer is coated on an aluminum support which had a chromate conversion coating and is etched at 75° C. for 1 hour in 20 percent sodium hydroxide. No apparent degradation of the polymer is observed.

EXAMPLE 24-Lithographic Plate

A formulation is prepared from:

| | |
|---|---|
| Copolymer of Example 2 | 0.8 g. |
| Cyclohexanone | 12 cc. |
| 4-Butyrolactone | 8 cc. |

The mixture is heated to effect solution and the solution is whirl coated on an anodized lithographic aluminum plate. The plate is exposed imagewise to an xenon source. The plate is then swab developed with cyclohexanone and run on a duplicator press to give 500 impressions.

EXAMPLE 25-COMPARISON OF POLYSULFONATES WITH PRIOR ART LIGHT-SENSITIVE POLYMERS

Four ⅛-inch aluminum supports are pumiced, cleaned in alkaline solution, and treated for 3 minutes at room temperature with a chromate conversion solution. Formulation A, a 10 percent dope of a copolycarbonate of 1.98 moles of tetrachlorobisphenol A, 2.557 moles divanillalcyclopentanone, and 4.537 moles of 1,3-dichloroformyloxy-2,2-dimethylpropane prepared by a procedure described in Example 18 of Borden et al. U.S. Pat. No. 3,453,237, is whirl coated on one of the supports at 80 r.p.m. for 1 hour at room temperature. A second formulation, "B," a resist composition based on poly(vinyl cinnamate) and described in column 4 of Minsk et al. U.S. Pat. No. 2,690,966, is coated on another of the supports in a similar manner. A third formulation "C," based on cyclized natural rubber and described in U.S. Pat. No. 2,940,853, is similarly coated on a third support. The fourth formulation, "D," consists of a 10 percent dope of the polymer of Example 5 in dichloroethane and is similarly coated on the fourth support. These four plates are prebaked for 10 minutes at 80° C. and exposed imagewise for 5 minutes at a distance of 4 feet to a 95-ampere carbon arc (6,500 foot candle minutes) through a 0.15 log E density step table. The relative photographic speed is measured by the last visible step obtained after development. Plates A and D are tray developed with dichloroethane for 1.5 minutes. Plate B is developed in a trichloroethylene vapor degreaser for 15 seconds at 2 pounds spray pressure. Plate C is developed in a spray tank with Stoddard solvent. After development, each plate is post baked for 10 minutes at 160° C. The relative speeds of the samples in relation to each other and the coating thickness of each sample are as follows.

| Plate | Coating Thickness (Mils) | Speed (Last Visible Step) |
|---|---|---|
| A | 0.22 | 1.10 |
| B | 0.12 | 1.25 |
| C | 0.28 | 1.40 |
| D | 0.13 | 1.40 |

The plates are then etched simultaneously with 20 percent sodium hydroxide solution at 150° F. until breakdown. Sample D held up in the presence of hot alkali better than A and B but not as well as C, which is twice as thick a coating.

The invention has been described in detail with particular reference to preferred embodiments thereof, but it will be understood that variations and modifications can be effected within the spirit and scope of the invention.

What is claimed is:

1. A light-sensitive, linear, film-forming polysulfonate reaction product of an aromatic disulfonyl chloride and a light-sensitive bisphenol containing the styryl ketone group.

2. A light-sensitive polysulfonate as defined in claim 1 wherein the light-sensitive bisphenol is selected from the group consisting of dihydroxy chalcones and dihydroxy dibenzal ketones.

3. A light-sensitive polymer of claim 1 wherein the aromatic disulfonyl chloride has the formula:

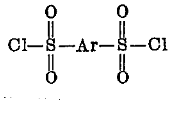

wherein Ar represents an arylene group.

4. A light-sensitive polysulfonate as defined in claim 1 wherein the aromatic disulfonyl chloride has the formula:

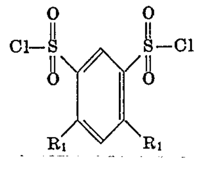

wherein each $R_1$ is selected from the group consisting of hydrogen atoms and lower alkyl groups, and the light-sensitive bisphenol has the formula:

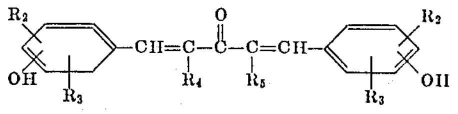

wherein $R_2$ and $R_3$ are each selected from the group consisting of hydrogen atoms and lower alkoxy groups, and $R_4$ and $R_5$ are each hydrogen atoms or together represent the hydrocarbon radical necessary to complete a saturated ring of five to six carbon atoms.

5. A light-sensitive polysulfonate as defined in claim 1 wherein the aromatic disulfonyl chloride is a phenylene disulfonyl chloride selected from the group consisting of 1,3-benzenedisulfonyl chloride, 1-methyl-2,4-benzenedisulfonyl chloride and 1.3-dimethyl-4,6-benzenedisulfonyl chloride, and the light-sensitive bisphenol is selected from the group consisting of divanillalacetone, divanillalcyclopentanone and divanillalcyclohexanone, 6. A light-sensitive polysulfonate as defined in claim 1 further containing recurring units of a non-light-sensitive bisphenol which comprises up to 95 mole percent of the bisphenols.

7. A light-sensitive polysulfonate as defined in claim 4 further containing recurring units of a non-light-sensitive bisphenol which comprises up to 95 mole percent of the bisphenols, the non-light-sensitive bisphenol having the formula:

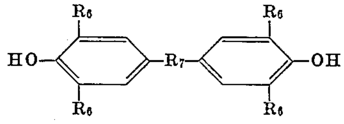

wherein $R_6$ is selected from the group consisting of hydrogen, chlorine and bromine atoms, and $R_7$ is selected from the group consisting of alkylene and oxoalkylene groups.

8. A light-sensitive polysulfonate as defined in claim 5 further containing recurring units of a non-light-sensitive bisphenol which comprises up to 95 mole percent of the bisphenols, the non-light-sensitive bisphenol being selected from the group consisting of 2,2-bis(4-hydroxyphenyl)propane, 1,5-bis(4hydroxy-3-methoxyphenyl)pentan-3-one, 2,6-bis(4hydroxy-3-methoxybenzyl)cyclohexanone, and 2,5-bis(4hydroxy-3-methoxybenzyl)cyclopentanone.

9. A light-sensitive polysulfonate containing recurring units of 1,3-benzenedisulfonyl chloride alternating with recurring units derived from equimolar amounts of 2,2-bis(4-hydroxyphenyl)propane and divanillalacetone.

10. A light-sensitive polysulfonate containing recurring units of 1-methyl-2,4-benzenedisulfonyl chloride alternating with recurring units derived from equimolar amounts of 2,2-bis(4-hydroxyphenyl)propane and divanillalacetone.

11. A light-sensitive polysulfonate containing recurring units of 1-methyl-2,4benzenedisulfonyl chloride alternating with recurring units derived from equimolar amounts of 2,2-bis(4-hydroxyphenyl)propane and divanillalcyclopentanone.

12. A photosensitive coating composition comprising a light-sensitive polysulfonate containing recurring units of an aromatic disulfonyl chloride and recurring units derived from a light-sensitive bisphenol containing the styryl ketone group, and a solvent therefor.

13. A photosensitive coating composition as defined in claim 12 wherein the aromatic disulfonyl chloride has the formula:

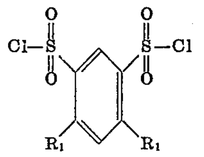

wherein each $R_1$ is selected from the group consisting of hydrogen atoms and lower alkyl groups, and the light-sensitive bisphenol has the formula:

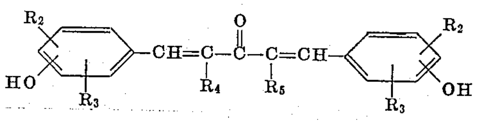

wherein $R_2$ and $R_3$ are each selected from the group consisting of hydrogen atoms and lower alkoxy groups, and $R_4$ and $R_5$ are each hydrogen atoms or together represent the hydrogen radical necessary to complete a saturated ring of five to six carbon atoms, and the solvent is a volatile organic solvent.

14. A photosensitive coating composition as defined in claim 13 wherein the aromatic disulfonyl chloride is a phenylene disulfonyl chloride selected from the group consisting of 1,3-benzenedisulfonyl chloride,
1-metyyl-2,4-benzenedisulfonyl chloride and
1,3-dimethyl-4,6-benzenedisulfonyl chloride, and the light-sensitive bisphenol is selected from the group consisting of divanillalacetone,
divanillalcyclopentanone and
divanillalcyclohexanone.

15. A photosensitive coating composition as defined in claim 14 wherein the solvent is a mixture of cyclohexanone and butyrolactone.

16. A photosensitive element comprising a support bearing a layer of a light-sensitive polysulfonate reaction product of an aromatic disulfonyl chloride and a light-sensitive bisphenol containing the styryl ketone group.

17. A photosensitive element as defined in claim 16 wherein the aromatic disulfonyl chloride has the formula:

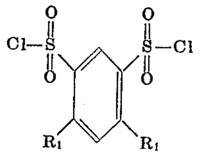

wherein each $R_1$ is selected from the group consisting of hydrogen atoms and lower alkoxy groups, and the light-sensitive bisphenol has the formula:

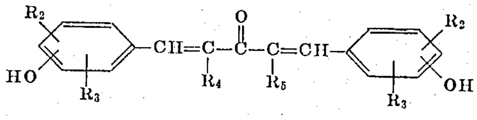

wherein $R_2$ and $R_3$ are each selected from the group consisting of hydrogen atoms and lower alkoxy groups, and $R_4$ and $R_5$ are each hydrogen atoms or together represent the hydrocarbon radical necessary to complete a saturated ring of five to six carbon atoms.

18. A photosensitive element as defined in claim 17 wherein the light-sensitive polysulfonate further contains recurring units of a non-light-sensitive bisphenol which comprises up to 95 mole percent of the bisphenols, the non-light-sensitive bisphenol having the formula:

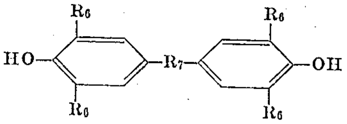

wherein $R_6$ is selected from the group consisting of hydrogen, chlorine and bromine atoms, and $R_7$ is selected from the group consisting of alkylene and oxoalkylene groups.

19. A process for preparing a photochemical image which comprises exposing to actinic radiation a photosensitive element comprising a support bearing a layer of a light-sensitive polysulfonate reaction product of an aromatic disulfonyl chloride and a light-sensitive bisphenol containing the styryl ketone group to insolubilize the polysulfonate in exposed areas and developing an image by removing unexposed noninsolubilized material from the element.

20. A process as defined in claim 19, wherein development is effected by removing unexposed noninsolubilized polysulfonate with a solvent therefor, which is a nonsolvent for the insolubilized polysulfonate in exposed areas.

* * * * *

PO-1050
(5/69)

UNITED STATES PATENT OFFICE
CERTIFICATE OF CORRECTION

Patent No. 3,640,722 Dated February 8, 1972

Inventor(s) Joseph A. Arcesi and Frederick J. Rauner

It is certified that error appears in the above-identified patent and that said Letters Patent are hereby corrected as shown below:

Column 11, line 12 "hydrogen" , second occurrence, should be deleted and ---hydrocarbon--- inserted;

Column 11, line 19 "metyyl" should be deleted and ---methyl--- inserted;

Column 12, line 2 "alkoxy" should be deleted and ---alkyl--- inserted;

Column 12, line 29 "photochemical" should be deleted and ---photomechanical--- inserted; and Column 3, line 25

" 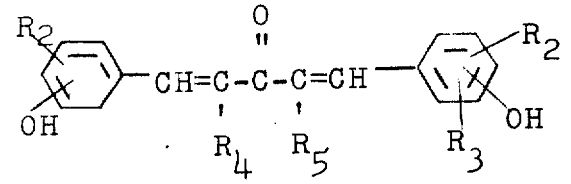 " should be deleted and

--- 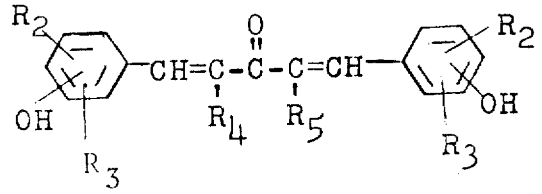 --- inserted.

Signed and sealed this 3rd day of October 1972.

(SEAL)
Attest:

EDWARD M.FLETCHER,JR.
Attesting Officer

ROBERT GOTTSCHALK
Commissioner of Patents